US012777916B2

(12) United States Patent
Xuan et al.

(10) Patent No.: US 12,777,916 B2
(45) Date of Patent: Oct. 27, 2026

(54) MICROELECTRONIC DEVICES INCLUDING CONTACT STRUCTURES, AND RELATED ELECTRONIC SYSTEMS AND METHODS

(71) Applicant: Micron Technology, Inc., Boise, ID (US)

(72) Inventors: Zhou Xuan, Singapore (SG); Sijia Yu, Singapore (SG); Biow Hiem Ong, Singapore (SG)

(73) Assignee: Micron Technology, Inc., Boise, ID (US)

(*) Notice: Subject to any disclaimer, the term of this patent is extended or adjusted under 35 U.S.C. 154(b) by 356 days.

(21) Appl. No.: 18/427,720

(22) Filed: Jan. 30, 2024

(65) Prior Publication Data

US 2024/0321741 A1 Sep. 26, 2024

Related U.S. Application Data

(60) Provisional application No. 63/491,410, filed on Mar. 21, 2023.

(51) Int. Cl.
*H10B 41/10* (2023.01)
*G11C 16/04* (2006.01)
(Continued)

(52) U.S. Cl.
CPC ....... *H10W 20/435* (2026.01); *G11C 16/0483* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02)

(58) Field of Classification Search
CPC . H10W 20/435; G11C 16/0483; H10B 41/10; H10B 41/27; H10B 41/35;
(Continued)

(56) References Cited

U.S. PATENT DOCUMENTS 5,231,054 A 7/1993 Kosugi
5,633,201 A 5/1997 Choi
(Continued)

FOREIGN PATENT DOCUMENTS

WO 2022/132537 A1 6/2022

OTHER PUBLICATIONS

European Extended Search Report and Opinion for European Application No. 24775685.1, dated May 29, 2026, 12 pages.
(Continued)

*Primary Examiner* — Evan G Clinton
(74) *Attorney, Agent, or Firm* — Traskbritt

(57) ABSTRACT

A microelectronic device comprises a stack structure comprising alternating conductive structures and insulative structures arranged in tiers. Each of the tiers individually comprises a conductive structure and an insulative structure. The microelectronic device comprises a staircase structure having steps comprising lateral ends of the tiers, and contacts overlying the steps at different elevations of the staircase structure. The contacts comprise a liner material. The microelectronic device comprises conductive plug structures underlying the liner material of the contacts and comprising lateral portions within voids in at least some of the conductive structures, and vertical portions overlying the lateral portions. Related electronic systems and methods are also described.

14 Claims, 5 Drawing Sheets

(51) Int. Cl.

| | |
|---|---|
| ***H10B 41/27*** | (2023.01) |
| ***H10B 41/35*** | (2023.01) |
| ***H10B 43/10*** | (2023.01) |
| ***H10B 43/27*** | (2023.01) |
| ***H10B 43/35*** | (2023.01) |
| ***H10W 20/41*** | (2026.01) |

(58) Field of Classification Search
CPC ........ H10B 43/10; H10B 43/27; H10B 43/35; H10B 41/50; H10B 43/50; H10B 20/00–41/70
See application file for complete search history.

(56) References Cited

U.S. PATENT DOCUMENTS

| | | | |
|---|---|---|---|
| 8,728,889 | B2 | 5/2014 | Lee et al. |
| 10,002,787 | B2 | 6/2018 | Yu et al. |
| 11,158,577 | B2 | 10/2021 | Ong et al. |
| 2010/0255669 | A1 | 10/2010 | Blomiley et al. |
| 2016/0343725 | A1 | 11/2016 | Jung et al. |
| 2017/0117222 | A1 | 4/2017 | Kim et al. |
| 2017/0309486 | A1 | 10/2017 | Jung et al. |
| 2019/0326166 | A1 | 10/2019 | Nam et al. |
| 2020/0091081 | A1 | 3/2020 | Hatazaki et al. |
| 2022/0020777 | A1 | 1/2022 | Baek et al. |
| 2022/0109001 | A1 | 4/2022 | Luo et al. |
| 2023/0022792 | A1 | 1/2023 | Scarbrough et al. |

OTHER PUBLICATIONS

International Search Report for International Application No. PCT/US2024/020819, mailed Jul. 3, 2024, 3 pages.

International Written Opinion for International Application No. PCT/US2024/020819, mailed Jul. 3, 2024, 3 pages.

MICROELECTRONIC DEVICES INCLUDING CONTACT STRUCTURES, AND RELATED ELECTRONIC SYSTEMS AND METHODS

CROSS-REFERENCE TO RELATED APPLICATION

This application claims the benefit under 35 U.S.C. § 119(c) of U.S. Provisional Patent Application Ser. No. 63/491,410, filed Mar. 21, 2023, the disclosure of which is hereby incorporated herein in its entirety by this reference.

TECHNICAL FIELD

The disclosure, in various embodiments, relates generally to the field of microelectronic device design and fabrication. More specifically, the disclosure relates to microelectronic devices (e.g., memory devices, such as 3D NAND memory devices) including staircase structures and contact structures at various step elevations of the staircase structures, and related electronic systems and methods of forming the microelectronic devices.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more conductive stack structures including tiers of conductive structures and insulative structures. Each vertical memory string may include at least one select device coupled in series to a serial combination of vertically stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the conductive stack structure(s) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the conductive stack structure(s) of the memory device. The staircase structure includes individual "steps" defining contact regions of the conductive structures, upon which conductive contact structures can be positioned to provide electrical access to the conductive structures. The conductive contact structures are formed to be in physical and electrical contact with the steps to provide electrical access to a conductive structure associated with each respective step. Since the steps are located at differing elevations within the staircase structures, the conductive contact structures are formed within openings exhibiting high aspect ratios (HAR).

DETAILED DESCRIPTION

Figure 1A:
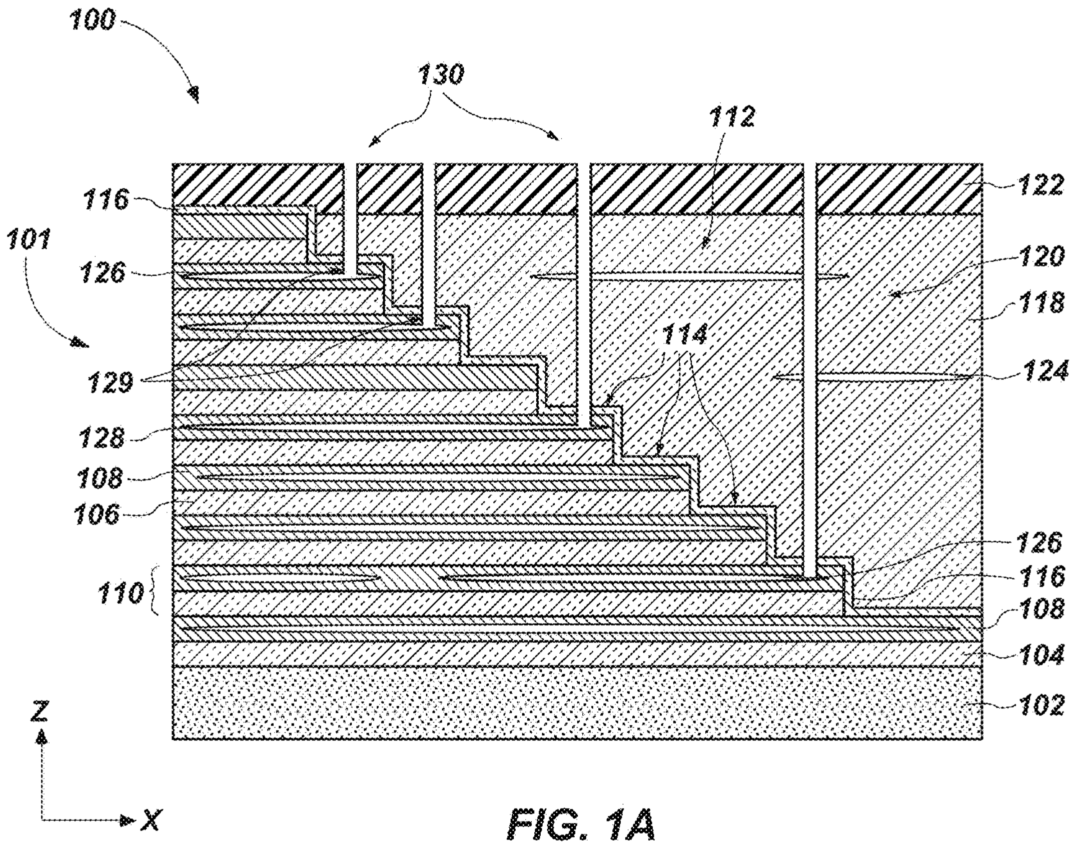
FIGS. 1A through 1F are simplified, partial longitudinal cross-sectional views (FIGS. 1A through 1D and 1F) and a simplified, partial top-down view (FIG. 1E) illustrating different processing stages of a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, the term "intersection" means and includes a location at which two or more features (e.g., regions, structures, materials, openings, devices) or, alternatively, two or more portions of a single feature meet. For example, an intersection between a first feature extending in a first direction (e.g., an X-direction) and a second feature extending in a second direction (e.g., a Y-direction, a Z-direction) different than the first direction may be the location at which the first feature and the second feature meet.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 108.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material, such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "$_x$," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

According to embodiments described herein, a microelectronic device comprises a stack structure comprising alternating conductive structures and insulative structures arranged in tiers, each of the tiers individually comprising a conductive structure and an insulative structure. The stack structure includes a staircase structure having steps comprising lateral ends of the tiers. Contacts (e.g., conductive contact structures) overlie the steps at different elevations of the staircase structure, and conductive plug structures underlie a liner material of the contacts. The conductive plug structures include lateral portions within voids (e.g., vertically central regions) in at least some of the conductive structures and vertical portions overlying the lateral portions. In some embodiments, the conductive plug structures comprise a different material composition than the conductive structures of the stack structure. A lateral extent of individual lateral portions of the conductive plug structures may be relatively greater than a lateral extent of respective vertical portions thereof, and the lateral extent of the individual lateral portions of the conductive plug structures may vary from one another throughout the stack structure. The conductive plug structures may facilitate improved alignment (e.g., vertical alignment) of the contacts with the conductive structures of the stack structure and may facilitate formation of electrical connections between the contacts and the conductive structures of the stack structure.

The microelectronic device may be formed by selectively forming conductive material within the voids in the conductive structures and within openings (e.g., contact openings) over the staircase structure to form the conductive plug structures prior to forming the contacts. In some embodiments, the conductive plug structures are formed to comprise tungsten, and the conductive structures are formed to comprise one or more of titanium, ruthenium, aluminum, and molybdenum. The conductive material may be formed within voids in conductive structures relatively proximate the openings, without the conductive material being formed within additional voids in the conductive structures relatively distal from the openings. The conductive material of the lateral portions and the vertical portions of the conductive plug structures may be formed in a single material formation process.

The conductive plug structures may facilitate formation of electrical connections between the contacts and the conductive structures of the stack structure without undesirably increasing an overall width (e.g., horizontal footprint) of the stack structure. In addition, formation of the conductive plug structures may facilitate improved electrical isolation between vertically adjacent conductive structures of the stack structure, which may result in reduced occurrences of bridging (e.g., electrical connection) between two or more vertically adjacent conductive structures. In some instances, the bridging between vertically adjacent conductive structures of conventional microelectronic devices may be the result of so-called "over etch" during fabrication of conventional contacts. The bridging may be mitigated with the formation of the conductive plug structures prior to forming the contacts, compared to only forming conventional contacts overlying conventional conductive structures.

Further, conventional conductive structures may include voids (e.g., seams) during formation of the stack structure, which increases resistivity during operation of conventional microelectronic devices. However, forming the lateral portions of the conductive plug structures within the voids in the conductive structures and forming the vertical portions overlying the lateral portions of the conductive plug structures prior to forming the contacts may facilitate improved electrical connections between the contacts and the conductive structures of the stack structure, which in turn may provide a reduced resistivity (e.g., electrical resistance levels) of the conductive materials thereof without significantly affecting conductivity. Further, forming the conductive plug structures to include a material composition (e.g., tungsten containing materials) that differs from a material composition (e.g., non-tungsten containing materials, such as titanium, ruthenium, aluminum, or molybdenum) of the conductive structures of the stack structure may also provide reduced resistivity. By forming the conductive plug structures (e.g., the lateral portions thereof), the voids in the conductive structures may be reduced and structural stability of the stack structure may be increased.

FIGS. 1A through IF illustrate a method of forming a microelectronic device structure, in accordance with embodiments of the disclosure. FIGS. 1A through 1D are simplified, longitudinal cross-sectional views of a microelectronic device structure 100. FIG. 1E illustrates an enlarged portion of a simplified, top-down view of the microelectronic device structure 100 taken along section line E-E of FIG. 1D, and FIG. 1F illustrates an enlarged portion of the longitudinal cross-sectional view of box F of FIG. 1D. Referring to FIG. 1A, the microelectronic device structure 100 may include a stack structure 101 vertically overlying a source structure 102 (e.g., a source plate, at least one source line) and insulative material 104 vertically overlying the source structure 102. The insulative material 104 may vertically intervene between the source structure 102 and the stack structure 101. The source structure 102 may be formed of and include, for example, a semiconductor material doped with one of at least one P-type conductivity material (e.g., polysilicon doped with at least one P-type dopant, such as one or more of boron, aluminum, and gallium) or at least one N-type conductivity material (e.g., polysilicon doped with at least one N-type dopant, such as one or more of arsenic, phosphorous, and antimony). The insulative material 104 may be formed of and include insulative material (e.g., $SiO_x$, an insulative, carbon-containing material).

The stack structure 101 includes a vertically (e.g., in the Z-direction) alternating sequence of at least two different materials. For example, the stack structure 101 (e.g., a conductive stack structure) may include a vertically alternating sequence of insulative structures 106 and conductive structures 108 arranged in tiers 110 (e.g., conductive tiers). Each of the tiers 110 may individually include one or more of the insulative structures 106 and one or more of the conductive structures 108 directly vertically adjacent to the insulative structure 106. In some embodiments, the insulative material 104 serves as a lowermost insulative structure 106 vertically overlying (e.g., directly on) the source structure 102, such that an additional insulative material is not present between the source structure 102 and the stack structure 101. The insulative structures 106 of the stack structure 101 may also be referred to herein as "insulative materials" and the conductive structures 108 of the stack structure 101 may also be referred to herein as "conductive materials."

In some embodiments, a number (e.g., quantity) of tiers 110 of the stack structure 101 are within a range of from 32 to 256 of the tiers 110. In some embodiments, the stack structure 101 includes 128 of the tiers 110. However, the disclosure is not so limited, and the stack structure 101 may include a different quantity of the tiers 110. The stack structure 101 may comprise at least one (e.g., one, two, more than two) deck structure vertically overlying the source structure 102. For example, the stack structure 101 may comprise a single deck structure or, alternatively, a dual deck structure for a 3D memory device (e.g., a 3D NAND Flash memory device).

The insulative structures 106 may be formed of and include, for example, at least one dielectric material, such as at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$). In some embodiments, the insulative structures 106 are formed of and include silicon dioxide ($SiO_2$).

The conductive structures 108 may be formed of and include conductive material including, but not limited to, n-doped polysilicon, p-doped polysilicon, undoped polysilicon, or a metal. In some embodiments, the conductive structures 108 comprise n-doped polysilicon. In other embodiments, the conductive structures 108 comprise tungsten (W). In other embodiments, the conductive structures 108 comprise a material including one or more of titanium (Ti), ruthenium (Ru), aluminum (Al), and molybdenum (Mo).

The conductive structures 108 of the stack structure 101 may be employed as access line (e.g., word line) structures (e.g., access line plates, word line plates) of the microelectronic device structure 100. The conductive structures 108 may individually be formed to at least partially replace initial sacrificial material (e.g., nitride material) by a so-called "replacement gate" or "gate last" process. The microelectronic device structure 100 may alternatively be formed by a so-called "gate first" process in which the tiers 110 having alternating conductive structures 108 and insulating structures 106 are formed prior to forming additional structures, as described in greater detail below. For instance, the tiers 110 having alternating conductive structures 108 and insulating structures 106 are present in the microelectronic device structure 100 prior to formation of the additional structures.

The microelectronic device structure 100 may be formed to include a staircase structure 112 within a staircase region of the stack structure 101. The staircase structure 112 may be formed, for example, by etching each of the tiers 110 to define steps 114 at a lateral end of each of the tiers 110. In some embodiments, the staircase structure 112 is formed prior to forming the conductive structures 108 through the replacement gate process. Liner material 116 may be formed to vertically overlie (e.g., in the Z-direction) the staircase structure 112, and then dielectric material 118 may be formed to fill a valley 120 (e.g., a space, an opening) vertically overlying the staircase structure 112. The staircase structure 112 (and the valley 120 partially defined by the staircase structure 112) include a stepped cross-sectional profile in the ZX-plane, as shown in FIG. 1A. The stepped cross-sectional profile of the staircase structure 112 (and of the valley 120) may be defined by the geometric configurations of the steps 114 of the staircase structure 112. While FIG. 1A illustrates only a single staircase structure 112, additional staircase structures 112 may be formed before, concurrently with, or subsequent to forming the staircase structure 112. For example, a second staircase structure may be formed opposing the staircase structure 112.

The liner material 116 may be formed to vertically overlie (e.g., in the Z-direction) the staircase structure 112, the vertically uppermost tier 110 of the insulative structures 106 and the conductive structures 108. As shown in FIG. 1A, the liner material 116 may include upper portions horizontally extending across (e.g., in the X-direction) and substantially covering upper surfaces of the steps 114, and side portions vertically extending across (e.g., in the Z-direction) and substantially covering side surfaces of the steps 114. The liner material 116 may be formed to include a substantially continuous material (e.g., a substantially continuous liner material) on or over the steps 114 of the staircase structure 112. In other embodiments, the liner material 116 includes the upper portions on the upper surfaces of the steps 114, without including the side portions covering the side surfaces of the steps 114.

The liner material 116 may include one or more insulative liner materials (e.g., a first liner material 116*a* (FIG. 1F) and a second liner material 116*b* (FIG. 1F) overlying the first liner material 116*a*). For example, the first liner material 116*a* may be formed of and include at least one insulative material, such as one or more of the materials described above with reference to the insulative structures 106. The second liner material 116*b* may exhibit etch selectivity relative to the insulative structures 106, the dielectric material 118, and the first liner material 116*a* of the liner material 116. The second liner material 116*b* may be formed of and include, for example, one or more of silicon nitride ($Si_3N_4$), silicon oxycarbide ($SiO_xC_y$), silicon oxynitride ($SiO_xN_y$), hydrogenated silicon oxycarbide ($SiC_xO_yH_z$), or silicon oxycarbonitride ($SiO_xC_yN_z$). The second liner material 116*b* may include low-k dielectric material, such as dielectric nitride material or dielectric oxide material, having a dielectric constant (k) lower than the dielectric constant of silicon nitride ($Si_3N_4$) material, of silicon oxide ($SiO_x$, $SiO_2$) material, or of a carbon-doped silicon oxide material that includes silicon atoms, carbon atoms, oxygen atoms, and hydrogen atoms. In some embodiments, the first liner material 116*a* of the liner material 116 comprises $SiO_2$, and the second liner material 116*b* thereof comprises $Si_3N_4$.

An upper dielectric material 122, which may serve as a mask material, may be located over an uppermost one of the tiers 110 of the stack structure 101. The upper dielectric material 122 may be formed of and include insulative material, such as, for example, one or more of phosphosilicate glass (PSG), borosilicate glass (BSG), fluorosilicate glass (FSG), borophosphosilicate glass (BPSG), and silicon dioxide ($SiO_2$). In some embodiments, the upper dielectric material 122 comprises the same material composition as the insulative structures 106 (e.g., $SiO_2$).

In some instances, voids 124 (e.g., gaps) may be formed within the dielectric material 118 during fabrication of the microelectronic device structure 100. For example, the dielectric material 118 may include one or more of the voids 124 during formation of the dielectric material 118 within the valley 120 exhibiting a high aspect ratio (HAR). Further, additional voids 126 (e.g., gaps, seams) may be formed within regions 128 (e.g., vertically central regions) of at least some of the conductive structures 108 during fabrication of the stack structure 101. For example, the conductive structures 108 may include one or more of the additional voids 126 within the regions 128 as a result of material formation (e.g., growth, deposition) processes used to form the conductive material (e.g., W) of the conductive structures 108. In some instances, the additional voids 126 may be present in locations of residual portions of the sacrificial materials (e.g., nitride materials) of the tiers 110 removed during the replacement gate process.

With continued reference to FIG. 1A, openings 130 (e.g., contact openings) may be formed within the dielectric material 118 overlying the staircase structure 112. The openings 130 vertically extend through the upper dielectric material 122, the dielectric material 118, and the liner material 116 to expose the conductive structures 108 of the stack structure 101 and the steps 114 of the staircase structure 112. The openings 130 may have any suitable transverse cross-sectional shape such as, for example, a substantially circular cross-sectional shape, a substantially square cross-sectional shape, a substantially elliptical cross-sectional shape, or a substantially triangular cross-sectional shape. In some embodiments, each of the openings 130 individually exhibits a substantially circular cross-sectional shape having a substantially circular cross-sectional area. While four openings 130 are shown in FIG. 1A for clarity, additional openings 130 may be formed within the dielectric material 118 overlying the stack structure 101.

The openings 130 may extend from an upper surface of the upper dielectric material 122 to or within an uppermost conductive structure 108 of individual steps 114 of the staircase structure 112. For example, lower vertical boundaries of the openings 130 may be defined by upper surfaces of the conductive structures 108 (e.g., the steps 114 of the staircase structure 112). Alternatively or additionally, at least some of the openings 130 may extend below the upper surfaces of the conductive structures 108 and within portions (e.g., upper portions) of the conductive material thereof to expose the additional voids 126 within the regions 128. The openings 130 may individually be formed to intersect the additional voids 126 within the regions 128 of the conductive structures 108 at intersections 129. Horizontal boundaries of the openings 130 may be defined by surfaces (e.g., side surfaces) of each of the upper dielectric material 122, the dielectric material 118, the liner material 116, and remaining portions of the conductive material of conductive structures 108. The openings 130 may be configured (e.g., sized and shaped) to receive subsequently formed structures, as shown in FIG. 1D.

At least some of the openings 130 have different depths and/or different aspect ratios (e.g., height-to-width ratios, depth-to-width ratios) than others of the openings 130. Some or all of the aspect ratios may be high aspect ratios (HAR) exhibiting, for example, at least about 3:1 (e.g., at least about 10:1) for a shallowest opening 130. Though the openings 130 of the figures are illustrated with vertical sidewalls, in some embodiments the sidewalls may be angled (e.g., tapered).

Figure 1B:
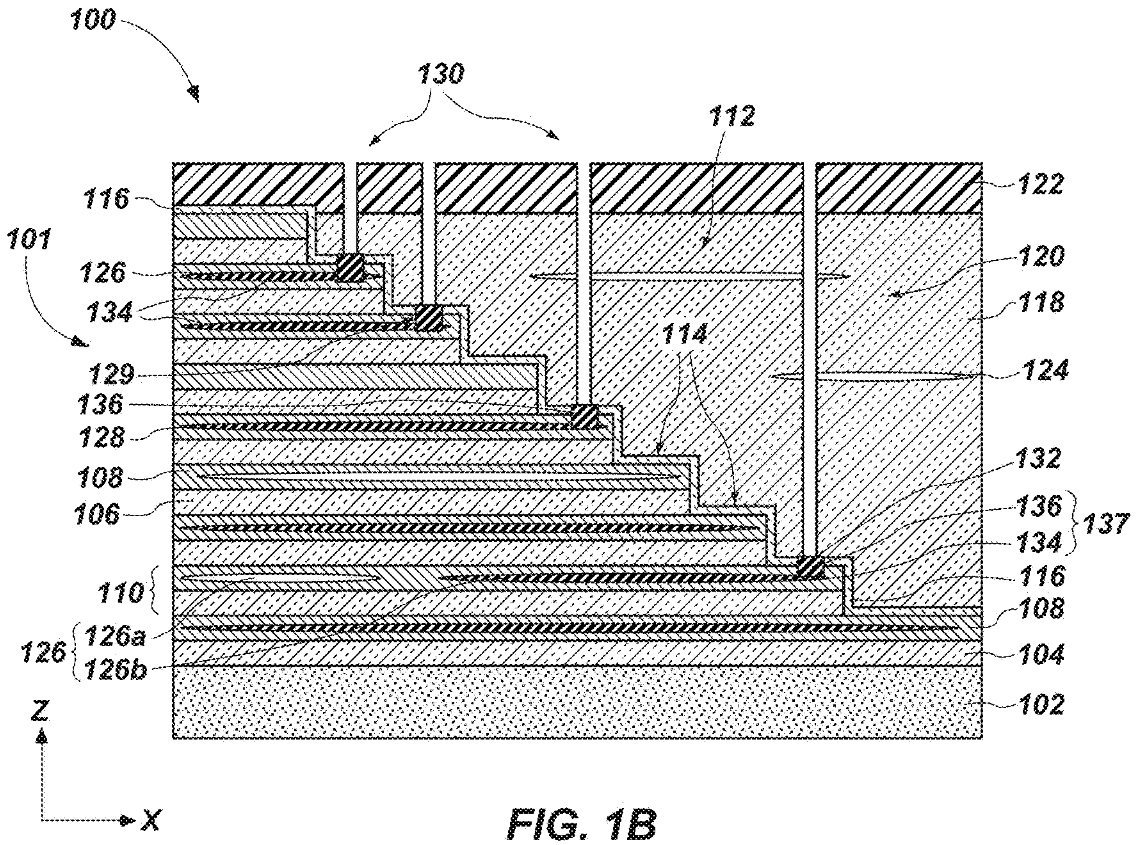

Referring to FIG. 1B, conductive material (e.g., one or more of the conductive materials described above with respect to that of the conductive structures 108, such as W) is selectively formed (e.g., grown) on only the conductive structures 108 exposed within the openings 130 to form selective conductive material 132. For example, after forming the openings 130, native oxides may be removed from the exposed conductive structures 108 (e.g., at the bottom of openings 130), followed by a surface treatment of the exposed portions of the conductive structures 108 to prepare the exposed surfaces for formation (e.g., growth, deposition) of the selective conductive material 132. The selective conductive material 132 may then be formed (e.g., grown, deposited) with selectivity on only the exposed portions of the conductive structures 108, without being formed on the upper dielectric material 122, the dielectric material 118 including portions thereof within the voids 124, and the liner material 116.

The selective conductive material 132 may be, in whole or in part, crystalline (e.g., monocrystalline, polycrystalline) or amorphous. In addition, a material composition of the selective conductive material 132 may be substantially the same or different than a material composition of the conductive material of the conductive structures 108. For example, the selective conductive material 132 may exhibit a material structure (e.g., a crystalline structure) that differs from a material structure of the conductive structures 108. In some embodiments, the selective conductive material 132 comprises tungsten, and the conductive structures 108 comprise one or more of titanium, ruthenium, aluminum, and molybdenum, such that the conductive structures 108 are substantially devoid of tungsten.

The selective conductive material 132 may be formed of and include a material composition that is tailored for reducing (e.g., minimizing) the additional voids 126 that may occur during formation of the conductive structures 108 of the stack structure 101. Accordingly, the material composition of the selective conductive material 132 may be selected for improved properties in forming (e.g., depositing, growing) such materials. The selective conductive material 132 may include a single material or, alternatively, multiple (e.g., two or more) materials having distinct boundaries therebetween. For example, formation of the selective conductive material 132 may include forming a first portion (e.g., a liner) having a first material composition adjacent to (e.g., directly on) the conductive material of the conductive structures 108 followed by formation of a second portion having a second material composition adjacent to (e.g., directly on) the first portion. Formation of the selective conductive material 132 may be used to mitigate the potential for incidence of voids, gaps, etc., occurring during formation of the stack structure 101 and to improve metal-to-metal contact between the selective conductive material 132 and the conductive material of the conductive structures 108 without allowing (e.g., promoting) buildup of the selective conductive material 132 along sidewalls of the dielectric material 118, for example, within the openings 130.

In some embodiments, the selective conductive material 132 is formed using a PVD process or a CVD process. The selective conductive material 132 may be formed of and include a material configured to enhance formation and conductivity of the material thereof. For example, the selective conductive material 132 may be formed of and include a single phase material (e.g., either a β-phase tungsten material or an α-phase tungsten material). The selective conductive material 132 may be formed (e.g., grown, deposited) adjacent (e.g., on, directly on) exposed surfaces (e.g., upper surfaces, side surfaces) of the conductive structures 108. The conductive material of the conductive structures 108 may be used as a seed material to form the selective conductive material 132. In some embodiments, a phase (e.g., β-phase, α-phase) of the selective conductive material 132 depends, at least in part, on a phase (e.g., β-phase, α-phase) of the material of the conductive structures 108 in embodiments that include, for example, the precursor material of the selective conductive material 132 being grown directly on the conductive structures 108.

In yet other embodiments, the selective conductive material 132 is formed using an ALD process. In some such embodiments, the selective conductive material 132 is formed with precursors comprising tungsten hexafluoride ($WF_6$) and silane ($SiH_4$) to form the selective conductive material 132. Accordingly, in some embodiments, the selective conductive material 132 is formed with halogen-containing precursors. In some such embodiments, the selective conductive material 132 includes at least some of the halogen (e.g., fluorine).

For example, a precursor material (e.g., a semiconductive liner material) may be formed of and include at least one semiconductive material, such as one or more of a silicon material, a silicon-germanium material, a boron material, a germanium material, a gallium arsenide material, a gallium nitride material, and an indium phosphide material. By way of non-limiting example, the precursor material may be formed of and include at least one silicon material. As used herein, the term "silicon material" means and includes a material that includes elemental silicon or a compound of silicon. The precursor material may, for example, be formed of and include or of more monocrystalline silicon and polycrystalline silicon. In some embodiments, the precursor material comprises polycrystalline silicon.

The precursor material may be formed to exhibit a desirable dimension (e.g., height, width) based, at least in part, on a desired dimension of the selective conductive material 132, and may be formed using one or more conventional conformal deposition processes, such as one or more of a conventional conformal CVD process and a conventional ALD process. In some embodiments, the precursor material is doped (e.g., impregnated) with one or more dopants (e.g., chemical species). The dopant(s) of the doped precursor material may comprise material(s) promoting or facilitating the subsequent formation of tungsten (e.g., β-phase tungsten) from the doped precursor material, as described in further detail below. In some embodiments, the dopant(s) comprise at least one N-type dopant, such as one or more of phosphorus (P), arsenic (As), antimony (Sb), and bismuth (Bi). In additional embodiments, the dopant(s) comprise at least one P-type dopant, such as one or more of boron (B), aluminum (Al), and gallium (Ga). In further embodiments, the dopant(s) comprise one or more of carbon (C), fluorine (F), chlorine (Cl), bromine (Br), hydrogen (H), deuterium ($^2H$), helium (He), neon (Ne), and argon (Ar).

The precursor material of the selective conductive material 132 may be doped with at least one dopant to form the doped precursor material using conventional processes (e.g., conventional implantation processes, conventional diffusion processes), which are not described in detail herein. As a non-limiting example, one or more phosphorus-containing species (e.g., phosphorus atoms, phosphorus-containing molecules, phosphide ions, phosphorus-containing ions) may be implanted into the precursor material to form the doped precursor material. The phosphorus-containing species may, for example, comprise phosphide ions ($P^{3-}$). As another non-limiting example, one or more arsenic-containing species (e.g., arsenic atoms, arsenic-containing molecules, arsenic ions, arsenic-containing ions) may be implanted into the precursor material to form the doped precursor material. The arsenic-containing species may, for example, comprise arsenic ions ($As^{3+}$). In some embodiments, following dopant implantation, an amount of dopant within the doped precursor material is within a range of from about 0.001 atomic percent to about 10 atomic percent. The individual portions of the doped precursor material of the selective conductive material 132 may individually exhibit a substantially homogencous distribution of dopant(s) within the semiconductive material thereof, or may individually exhibit a heterogeneous distribution of dopant(s) within the semiconductive material thereof.

Thereafter, portions of the doped precursor material may be converted into the selective conductive material 132 including tungsten and the dopant(s) of the doped precursor material. The conversion process may convert portions of the semiconductive material (e.g., silicon material, such as polycrystalline silicon) of the doped precursor material including dopant(s) dispersed therein into tungsten relatively faster than an undoped semiconductive material.

At least some of the tungsten of the selective conductive material 132 may comprise β-phase tungsten. β-phase tungsten has a metastable, A15 cubic structure. Grains of the β-phase tungsten may exhibit generally columnar shapes. Tungsten included within the selective conductive material 132 may only be present in the β-phase, or may be present in the beta (β) phase and in the alpha (α) phase. If present, the α-phase tungsten has a metastable, body-centered cubic structure. Grains of the α-phase tungsten may exhibit generally isometric shapes. If the selective conductive material 132 includes β-phase tungsten and α-phase tungsten, an amount of β-phase tungsten included therein may be different than an amount of α-phase tungsten included therein, or may be substantially the same as amount of α-phase tungsten included therein. In some embodiments, an amount of β-phase tungsten included in the selective conductive material 132 is greater than an amount of α-phase tungsten included therein. For example, at least a majority (e.g., greater than 50 percent, such as greater than or equal to about 60 percent, greater than or equal to about 70 percent, greater than or equal to about 80 percent, greater than or equal to about 90 percent, greater than or equal to about 95 percent, or greater than or equal to about 99 percent) of the tungsten included in the selective conductive material 132 may be present in the β-phase.

The dopant(s) included in the selective conductive material 132 may be substantially the same as the dopant(s) included in the doped precursor material employed to form the selective conductive material 132. For example, dopant(s) (e.g., N-type dopants, P-type dopants, other dopants) used to form the selective conductive material 132 may be present therein following formation thereof. In some embodiments, the selective conductive material 132 includes β-phase tungsten doped with one or more of As and P. The dopant(s) of the selective conductive material 132 may support (e.g., facilitate, promote) the stability of the β-phase tungsten thereof.

The selective conductive material 132 may exhibit a substantially homogeneous distribution of the dopant(s) thereof, or may exhibit a heterogeneous distribution of the dopant(s) thereof. The distribution of the dopant(s) within the selective conductive material 132 may be substantially the same as or may be different than a distribution of the dopant(s) within the doped precursor material.

The selective conductive material 132 may be formed by treating the doped precursor material with one or more chemical species facilitating the conversion of the semiconductive material (e.g., silicon material) thereof into tungsten (e.g., β-phase tungsten, α-phase tungsten). By way of non-limiting example, if the doped precursor material comprises a doped silicon material, such as doped polycrystalline silicon, the doped precursor material may be treated with tungsten hexafluoride ($WF_6$) to form the selective conductive material 132. Silicon (Si) of the doped precursor material may react with the $WF_6$ to produce tungsten (W) and silicon tetrafluoride ($SiF_4$). The produced $SiF_4$ is removed as a gas. The produced W remains with the dopant(s) of the doped precursor material to form the selective conductive material 132. The doped precursor material may, for example, be treated with $WF_6$ using a conventional CVD apparatus at a temperature within a range of from about 200° C. to about 500° C.

With continued reference to FIG. 1B, the selective conductive material 132 may be in direct physical contact with the conductive structures 108 within horizontal portions of the additional voids 126 (e.g., within the regions 128 of the conductive structures 108) and within vertical portions of the openings 130. Accordingly, the selective conductive material 132 extends in at least one horizontal direction (e.g., the X-direction, the Y-direction) and in a vertical direction (e.g., the Z-direction) that is substantially orthogonal to the horizontal direction. Formation of the selective conductive material 132 results in formation of lateral portions 134 within the additional voids 126 within the regions 128 of the conductive structures 108 and in formation of vertical portions 136 within the lower portions of the openings 130, resulting in formation of conductive plug structures 137. The conductive plug structures 137 include the lateral portions 134 (e.g., conductive fill material) and the vertical portions 136 (e.g., conductive plugs, plug regions) of the selective conductive material 132.

The selective conductive material 132 of the conductive plug structures 137 may be formed (e.g., in a single material formation act) to a desired lateral extent (e.g., horizontal width) and to a desired thickness (e.g., vertical height). The selective conductive material 132 may at least partially (e.g., substantially) fill the additional voids 126 proximate the openings 130, such that a lateral extent of the lateral portions 134 is relatively larger than a lateral extent of the openings 130. The lateral portions 134 of the selective conductive material 132 may be substantially surrounded by the conductive material of the conductive structures 108. For example, the selective conductive material 132 may be adjacent to (e.g., directly adjacent to) the conductive material of the conductive structures 108 in one or more horizontal direction (e.g., the X-direction, the Y-direction) and in the vertical direction (e.g., the Z-direction). In addition, the selective conductive material 132 may at least partially fill (e.g., substantially fill) the lower portions of at least some (e.g., each) of the openings 130. In some embodiments, additional portions of the selective conductive material 132 substantially surrounds (e.g., substantially laterally surrounds) the lower portions of the openings 130.

In some embodiments, the additional voids 126 within the regions 128 of the conductive structures 108 may be enlarged (e.g., laterally recessed, vertically recessed) through one or more material removal processes prior to forming the selective conductive material 132 therein. For example, residual portions of the conductive material of the conductive structures 108 may remain proximate to the openings 130 that at least partially "pinch off" and close (e.g., seal) regions between the openings 130 and the additional voids 126. The residual portions of the conductive material of the conductive structures 108 proximate to the openings 130 may be selectively removed, such as by etching, to recess the conductive material of the conductive structures 108 within the regions 128 thereof and to expand the additional voids 126. Thus, portions of the conductive material located centrally within the conductive structures 108 may be recessed (e.g., removed) and additional portions of the conductive material of the conductive structures 108 may be present within a perimeter of the conductive structures 108 (e.g., adjacent to the insulative structures 106). The selective conductive material 132 may be formed adjacent to (e.g., directly adjacent to) exposed surfaces of the conductive material of the conductive structures 108 within the regions 128 thereof to form the lateral portions 134 and within the lower portions of the openings 130 to form the vertical portions 136 of the conductive plug structures 137. The selective conductive material 132 may substantially completely fill a remainder of the regions 128 of the conductive structures 108 so as to substantially fully extend between exposed surfaces (e.g., upper surfaces, lower surfaces, side surfaces) of the conductive material of the conductive structures 108.

In some embodiments, the vertical portions 136 of at least some of the conductive plug structures 137 extend vertically above the liner material 116, such that upper surfaces of the vertical portions 136 are vertically above upper surfaces of the liner material 116 and, thus, vertically above the upper surfaces of the conductive structures 108 at the steps 114. In some embodiments, the thickness of the vertical portions 136 of the conductive plug structures 137 is one or more times greater than an initial thickness of each of the conductive structures 108. Individual vertical portions 136 of the selective conductive material 132 may be formed to the same thickness of grown (e.g., deposited) conductive material. In additional embodiments, the upper surfaces of the vertical portions 136 of the conductive plug structures 137 may be substantially coplanar with upper surfaces of one or more of the liner material 116 and the conductive structures 108 at the steps 114.

In some embodiments, formation of the openings 130 results in some loss of material from exposed portions (e.g., upper portions) of the conductive structures 108. In some such embodiments, the vertical portions 136 of the selective conductive material 132 formed within the openings 130 extend to varying heights above an upper surface of the respective conductive structure 108, as well as to varying depths below the upper surface thereof. In some embodiments, the vertical portions 136 of at least some of the conductive plug structures 137 are vertically recessed relative to the liner material 116, such that uppermost boundaries (e.g., upper surfaces) of the vertical portions 136 are vertically below lowermost boundaries (e.g., lower surfaces) of the liner material 116 (e.g., at or below the upper surfaces of the conductive structures 108 at the steps 114). In some such embodiments, the conductive plug structures 137 are substantially free of a liner material on the side surfaces of the vertical portions 136 of the conductive plug structures 137. In yet other embodiments, the vertical portions 136 of the conductive plug structures 137 are horizontally adjacent to the conductive structures 108 without being vertically adjacent thereto. For example, the vertical portions 136 of at least some of the conductive plug structures 137 may be vertically recessed relative to the upper surfaces of the conductive structures 108, such that upper surfaces of the vertical portions 136 are vertically below the upper surfaces of the conductive structures 108 at the steps 114.

As shown in FIG. 1B, the additional voids 126 within the regions 128 of the conductive structures 108 may include first regions 126*a* (e.g., unfilled regions) and second regions 126*b* (e.g., filled regions). The first regions 126*a* of the additional voids 126 may be remote (e.g., isolated, relatively distal) from the openings 130 and, hence, remote from the lateral portions 134 of the selective conductive material 132. Accordingly, at least some (e.g., each) of the first regions 126*a* may be substantially devoid of the selective conductive material 132. The second regions 126*b* may be located proximate (e.g., relatively proximate) to the openings 130 and may be at least partially (e.g., substantially completely) filled with the selective conductive material 132 upon formation of the lateral portions 134 thereof. Since the selective conductive material 132 is formed through the openings 130, the lateral portions 134 thereof may be formed in the second regions 126*b* without being formed in the first regions 126*a* of the additional voids 126.

In some embodiments, the selective conductive material 132 within the second regions 126*b* of the additional voids 126 is substantially centered along a horizontal centerline of the conductive structures 108. A horizontal centerline of the selective conductive material 132 may be substantially aligned with a horizontal centerline of the conductive structures 108 with substantially equal portions of the conductive material of the conductive structures 108 located above and below the selective conductive material 132. However, the disclosure is not so limited, and the additional voids 126 may be located in additional locations (e.g., relatively proximate to the insulative structures 106 of the stack structure 101). For example, the horizontal centerline of the selective conductive material 132 may be positioned above or, alternatively, below the horizontal centerline of the conductive structures 108 such that opposing portions of the conductive material of the conductive structures 108 include unequal thicknesses (e.g., heights) above and below the selective conductive material 132 within the regions 128 of the conductive structures 108. In some embodiments, the additional voids 126 are directly adjacent to one or more of the insulative structures 106.

Upon formation of the conductive material of the conductive structures 108, the additional voids 126 (e.g., seams) within the regions 128 of at least some of the conductive structures 108 may be unevenly formed as a result of material formation acts during formation of the stack structure 101. A location and extent (e.g., vertical extent, horizontal extent, volume) of the additional voids 126 may vary within the stack structure 101 of the microelectronic device structure 100. Accordingly, locations of the second regions 126*b* of the additional voids 126 including the lateral portions 134 of the selective conductive material 132 may vary (e.g., randomly vary) throughout the conductive structures 108 of the tiers 110. The first regions 126*a* may or may not be in communication (e.g., physically connected) with the second regions 126*b*. Further, individual conductive structures 108 within various tiers 110 of the stack structure 101 may or may not include the additional voids 126. The lateral portions 134 within the second regions 126*b* of the additional voids 126 may be adjacent to (e.g., vertically adjacent to, horizontally adjacent to, in direct contact with) the vertical portions 136 of the selective conductive material 132. By forming the selective conductive material 132 within the regions 128 of the conductive structures 108 in a second process act, the conductive structures 108 including the selective conductive material 132 may result in reduced voids in the tiers 110 compared to conventional conductive structures formed by using a single process act (e.g., a single deposition act of a single conductive material).

Figure 1C:
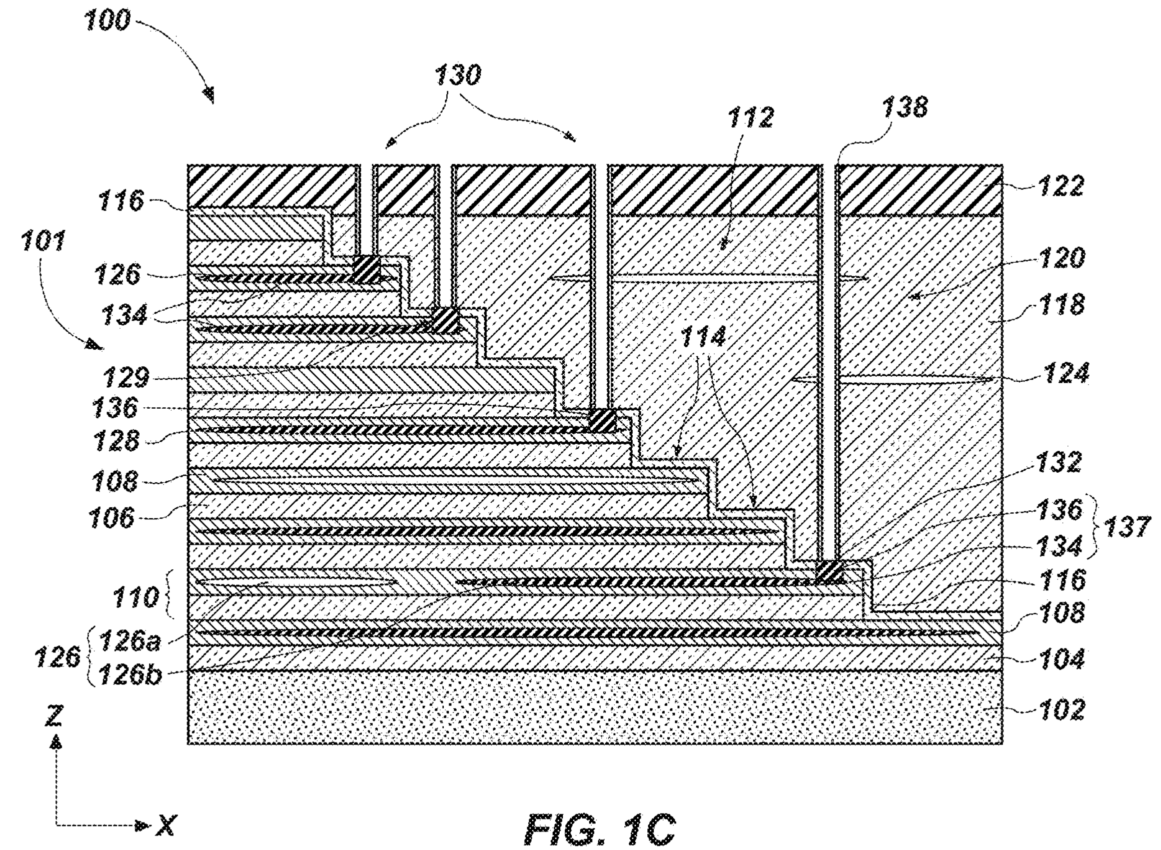
Figure 1D:
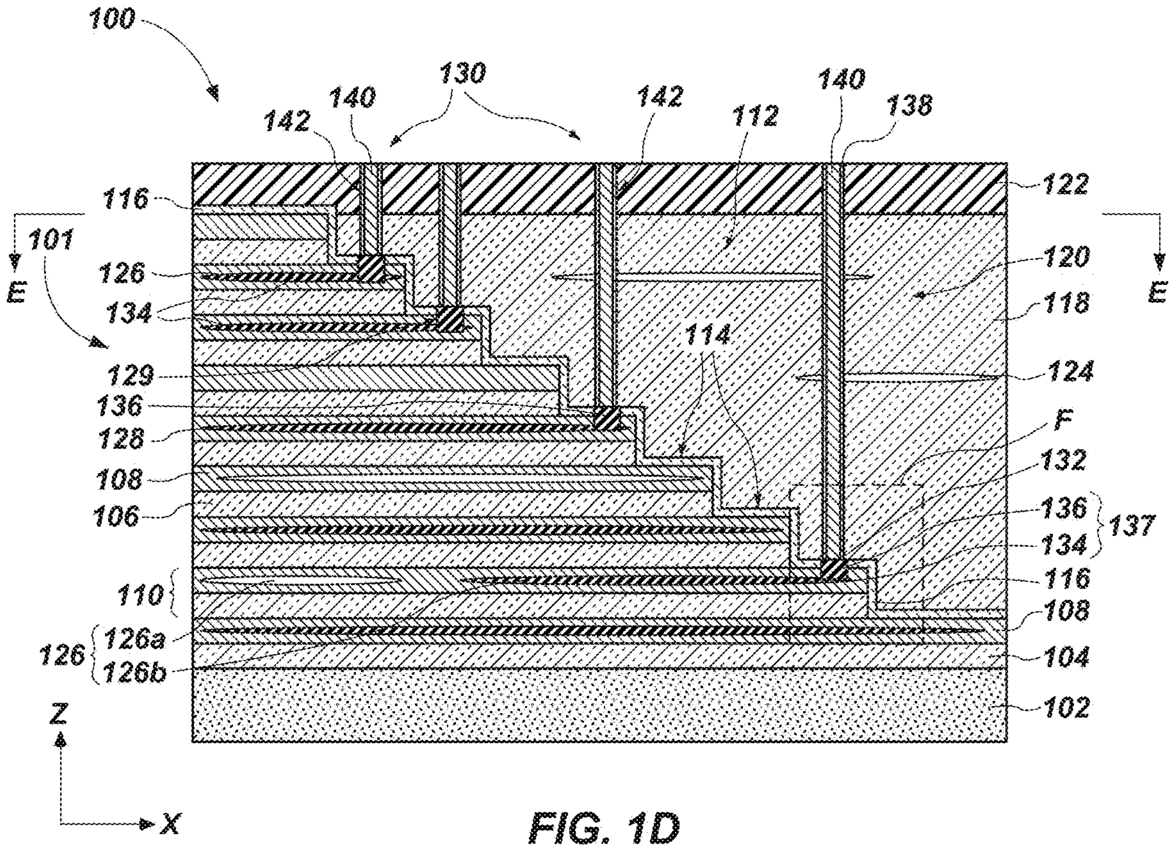
Figure 1E:
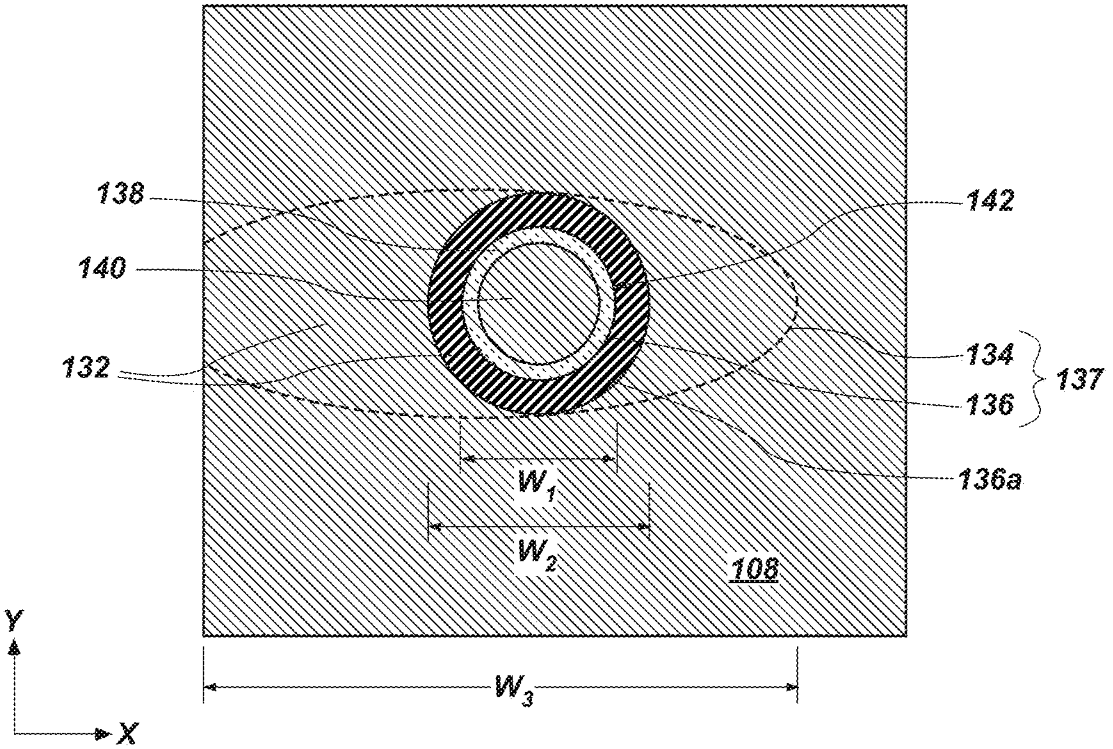
Figure 1F:
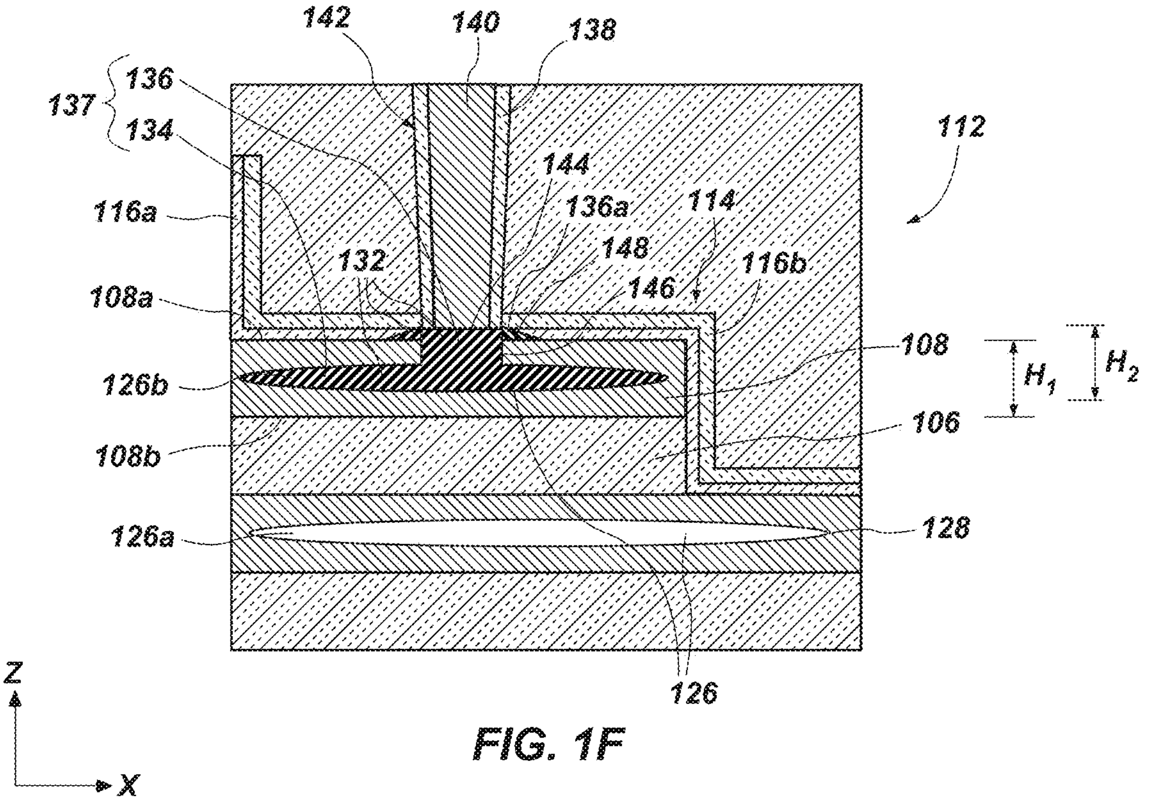

With reference to FIG. 1C, after forming the lateral portions 134 and the vertical portions 136 of the selective conductive material 132 (also described herein as the conductive plug structures 137), liner material 138 of contact structures 142 (FIG. 1D) may be formed (e.g., conformally formed) within the openings 130. The liner material 138 may be continuous along a vertical distance of the upper dielectric material 122 and the dielectric material 118. The liner material 138 may be formed of and include an insulative material, such as an oxide material, a nitride material, or an oxynitride material. In some embodiments, the liner material 138 includes a high quality silicon oxide material, such as an ALD $SiO_x$. The liner material 138 may be substantially uniform and substantially conformal as deposited. For example, the liner material 138 may be a substantially uniform and substantially conformal silicon oxide material (e.g., a highly uniform and highly conformal silicon dioxide material). The liner material 138 may be formulated to be formed in HAR openings, such as those having a HAR of at least about 20:1, at least about 50:1, at least about 100:1, or at least about 1000:1, without forming voids. The liner material 138 may exhibit an etch selectivity with respect to surrounding materials, including the liner material 116. The liner material 138 is formed by conventional techniques, such as by CVD or ALD. In some embodiments, the liner material 138 is formed by plasma-enhanced ALD (PEALD).

In some embodiments, a so-called "punch through" etch is then performed to remove portions of the liner material 138 and expose the underlying portions of the vertical portions 136 of the conductive plug structures 137. In some embodiments, lowermost surfaces of remaining portions of the liner material 138 extend to or beyond upper surfaces of the vertical portions 136 of the conductive plug structures 137. In other embodiments, a portion of one or more of the liner material 116 and the dielectric material 118 are laterally exposed below the lowermost surfaces of the liner material 138, such that the liner material 138 terminates above an elevational level of the vertical portions 136 of the conductive plug structures 137. Formation of the selective conductive material 132 prior to forming the liner material 138 and performing the punch through etch thereof may mitigate over etch compared to conventional formation processes.

Referring to FIG. 1D, after forming the liner material 138, additional conductive material 140 may be formed within the openings 130 to form the contact structures 142. The additional conductive material 140 may be formed to substantially fill remaining portions of the openings 130 extending vertically through the upper dielectric material 122 and the dielectric material 118 and to the conductive plug structures 137 (e.g., to the vertical portions 136 thereof). The contact structures 142 include the liner material 138 and the additional conductive material 140.

In some embodiments, the vertical portions 136 of the conductive plug structures 137 are interposed directly between the liner material 138 and the additional conductive material 140 of the contact structures 142 and the lateral portions 134 of the conductive plug structures 137. The contact structures 142 may be vertically separated from the conductive structures 108 of the stack structure 101 by the vertical portions 136 of the conductive plug structures 137. For example, the vertical portions 136 of the conductive plug structures 137 may vertically intervene between the contact structures 142 and the conductive structures 108, such that the additional conductive material 140 is vertically separated (e.g., in the Z-direction) from the conductive material of the conductive structures 108 by the conductive plug structures 137. In other embodiments, the additional conductive material 140 of the contact structures 142 extends to and contacts the conductive structures 108. For example, the additional conductive material 140 of the contact structures 142 may directly contact (e.g., directly physically contact) the conductive material of the conductive structures 108, such as when the vertical portions 136 of the conductive plug structures 137 are horizontally adjacent to the conductive structures 108 and vertically recessed relative to the upper surfaces thereof.

In some embodiments, the additional conductive material 140 extends vertically through portions (e.g., an entirety) of the liner material 116, such as when the vertical portions 136 of the conductive plug structures 137 are vertically recessed relative to the liner material 116 (e.g., the second liner material 116*b* (FIG. 1F)). The additional conductive material 140 may, therefore, be substantially surrounded by the liner material 138 and may physically contact (e.g., directly physically contact) the vertical portions 136 of the conductive plug structures 137. For example, the contact structures 142 may extend through the dielectric material 118, and in some embodiments through the liner material 116, to individually contact upper surfaces of the vertical portions 136 of the conductive plug structures 137. Outer side surfaces (e.g., sidewalls) of the contact structures 142 may individually exhibit a tapered vertical profile with an upper portion of individual contact structures 142 having a greater critical dimension (e.g., width) than a lower portion thereof.

The additional conductive material 140 may be one or more of the conductive materials described above with reference to the conductive structures 108. In some embodiments, the additional conductive material 140 of the contact structures 142 comprises the same material composition as the conductive structures 108 (e.g., W). In some embodiments, a material composition of the conductive plug structures 137 differs from a material composition of one or more (e.g., each) of the conductive structures 108 of the stack structure 101 and the additional conductive material 140 of the contact structures 142. Upper surfaces of the contact structures 142 may be planarized, such as by one or more CMP acts to facilitate or enhance the planarity of upper boundaries (e.g., upper surfaces) of the contact structures 142 for further processing thereon. While four contact structures 142 are shown in FIG. 1D for clarity, additional contact structures 142 may be formed within the microelectronic device structure 100.

FIG. 1E illustrates an enlarged portion of a simplified, top-down view of the microelectronic device structure 100 taken along section line E-E of FIG. 1D. For clarity and case of understanding the drawings and associated description, surrounding materials are absent from FIG. 1E. The lateral portions 134 of the selective conductive material 132 of the conductive plug structures 137 are illustrated in dashed lines, for clarity, to illustrate a location of the lateral portions 134 within the additional voids 126 (FIG. 1D) relative to locations of the contact structures 142, although it is understood that the lateral portions 134 of the selective conductive material 132 are vertically recessed within the regions 128 (FIG. 1D) of the conductive structures 108.

In some embodiments, the vertical portions 136 include additional portions 136*a* of the selective conductive material 132. The additional portions 136*a* may extend horizontally (e.g., in the X-direction, in the Y-direction) beyond an outer horizontal boundary of the contact structures 142 (e.g., the liner material 138 thereof) and, thus, beyond an outer horizontal boundary of the vertical portions 136 of the selective conductive material 132, as shown in FIG. 1E. The additional portions 136*a* of the selective conductive material 132 may, optionally, laterally surround the vertical portions 136 thereof at an elevational level of one or more of the conductive structures 108 and the first liner material 116*a* (FIG. 1F) over each step 114 (FIG. 1D) of the staircase structure 112 (FIG. 1D). Accordingly, the additional portions 136*a* may be located horizontally proximate to and may at least partially (e.g., substantially) surround the vertical portions 136 of the selective conductive material 132.

In some embodiments, the additional portions 136*a* of the selective conductive material 132 horizontally surround lower portions of the contact structures 142. In other embodiments, the additional portions 136*a* extend horizontally beyond the outer horizontal boundary of the contact structures 142 without being located horizontally proximate to the contact structures 142, such that uppermost surfaces of the selective conductive material 132 are vertically below the liner material 138 of the contact structures 142. In yet other embodiments, the vertical portions 136 of the selective conductive material 132 vertically underlie the contact structures 142 without the additional portions 136*a* extending horizontally beyond the outer horizontal boundary of the contact structures 142.

As shown in FIG. 1E, at least portions of the contact structures 142 including the liner material 138 and the additional conductive material 140 may be within horizontal boundaries (e.g., horizontal areas) of the lateral portions 134 of the conductive plug structures 137, although other configurations may be contemplated. Further, the vertical portions 136 may be within the horizontal boundaries of the lateral portions 134 of conductive plug structures 137. A lateral dimension (e.g., a first width $W_1$, a diameter in the X-direction) of an individual contact structure 142 may be relatively smaller than a lateral dimension (e.g., a second width $W_2$, a diameter in the X-direction) of the vertical portions 136 of the conductive plug structures 137 (e.g., the additional portions 136*a* thereof). In other embodiments, the second width $W_2$ is about the same size as the first width $W_1$. Since the contact structures 142 may individually exhibit a tapered vertical profile, the second width $W_2$ of the vertical portions 136 of the conductive plug structures 137 may be relatively larger than the first width $W_1$ at lower portions without being relatively larger than the first width $W_1$ at upper portions of the contact structures 142. A lateral dimension (e.g., a third width $W_3$, a diameter in the X-direction) of the lateral portions 134 of the conductive plug structures 137 may be relatively larger than one or more (e.g., each) of the first width $W_1$ and the second width $W_2$. Since a location and extent (e.g., horizontal extent) of the additional voids 126 (FIG. 1D) may vary within the stack structure 101 of the microelectronic device structure 100, the third width $W_3$ of the lateral portions 134 of the conductive plug structures 137 may vary (e.g., differ) from one another throughout the stack structure 101.

By way of non-limiting example, the first width $W_1$ may be within a range of from about 80 nm to about 200 nm, such as from about 80 nm to about 100 nm, from about 100 nm to about 150 nm, or from about 150 nm to about 200 nm, and the second width $W_2$ may be within a range of from about 100 nm to about 250 nm, such as from about 100 nm to about 150 nm, from about 150 nm to about 200 nm, or from about 200 nm to about 250 nm. The third width $W_3$ may be between about 2 and 10 times (e.g., an order of magnitude) greater than the second width $W_2$. By way of non-limiting example, the second width $W_2$ may be within a range of from about 110 nm to about 180 nm and the third width $W_3$ may be within a range of from about 200 nm to about 800 nm. For example, the third width $W_3$ may be within a range of from about 200 nm to about 400 nm, from 400 nm to about 600 nm, or from about 600 nm to about 800 nm, or even larger, depending on varying widths of the additional voids 126. Since the lateral portions 134 of the conductive plug structures 137 are within the uppermost conductive structures 108, the third width $W_3$ is such that a horizontal boundary of the lateral portions 134 does not horizontally extend beyond the steps 114 (FIG. 1D) in at least one direction (e.g., in the positive X-direction). However, one or more of the lateral portions 134 of the conductive plug structures 137 may horizontally extend beyond horizontal boundaries of overlying the steps 114 (e.g., in the negative X-direction).

FIG. 1F illustrates an enlarged portion of the longitudinal cross-sectional view of box F of FIG. 1D. For clarity and ease of understanding the drawings and associated description, surrounding materials are absent from FIG. 1F. Since at least some of the openings 130 (FIG. 1D) extend below an upper surface 108*a* of an individual conductive structure 108 and within portions (e.g., upper portions) of the conductive material thereof, the openings 130 may expose at least some of the additional voids 126 (e.g., the second regions 126*b*) within the regions 128 of the conductive structure 108. During formation of the microelectronic device structure 100, the openings 130 may be formed to extend below the upper surface 108*a* without extending to or beyond a lower surface 108*b* of the conductive structure 108. Upon formation of the conductive plug structures 137, the vertical portions 136 of the selective conductive material 132 may extend below the upper surface 108*a* without extending to or beyond the lower surface 108*b* of the conductive structure 108. In some embodiments, at least some of the vertical portions 136 of the selective conductive material 132 extend below an upper surface of the lateral portions 134 (e.g., within the second regions 126*b*) without extending beyond a lower surface of the lateral portions 134 thereof. For convenience, the lateral portions 134 and the vertical portions 136 are illustrated as being separate portions of the selective conductive material 132, although it is understood that the selective conductive material 132 may include a single, continuous portion of conductive material.

The vertical portions 136 directly contact (e.g., directly physically contact) the lateral portions 134 of the conductive plug structures 137 and directly contact the additional portions 136*a* thereof, if present. Elongated portions of the lateral portions 134 extend in at least one horizontal direction (e.g., in the X-direction, in the Y-direction), and elongated portions of the vertical portions 136 extend in the vertical direction (e.g., in the Z-direction) orthogonal to the horizontal direction. The lateral portions 134 substantially surround (e.g., substantially laterally surround) the vertical portions 136 of the conductive plug structures 137 in at least one horizontal direction. The lateral portions 134 of the conductive plug structures 137 may be formed within the regions 128 of the conductive structures 108 and the vertical portions 136 of the conductive plug structures 137 may be formed within the openings 130 (FIG. 1D) in a single material formation process. The lateral portions 134 and the vertical portions 136 (e.g., including the additional portions 136*a*) of the conductive plug structures 137 may include substantially the same material composition with no readily discernable physical interface therebetween. Alternatively, the lateral portions 134 and the vertical portions 136 thereof may include a material composition that differs from one another, such that a material composition of the vertical portions 136 (e.g., the plug region) differs from a material composition of the lateral portions 134 of the conductive plug structures 137.

The lateral portions 134 and the vertical portions 136 of the selective conductive material 132 may individually form a generally "L-shaped" structure of the conductive plug structures 137 proximate uppermost conductive structures 108 at the individual steps 114. Therefore, the conductive plug structures 137 physically contact an uppermost one of the conductive structures 108 at the steps 114 on at least two consecutive sides (e.g., a lateral side and a vertical side). Thus, multidimensional (e.g., two-dimensional) contact regions of the uppermost conductive structures 108 may be exposed for formation of two corresponding consecutive sides of the conductive plug structures 137 thereon. Exposing the multidimensional contact regions of the uppermost conductive structures 108 further enhances (e.g., further increases) an available area having more than one side (e.g., two sides) in which to form the selective conductive material 132 of the conductive plug structures 137.

As previously described with reference to FIG. 1B, the first regions 126*a* of the additional voids 126 may be remote from the openings 130 (FIG. 1D) and, thus, remote from the lateral portions 134 of the selective conductive material 132.

The second regions 126*b* may be located proximate to the openings 130 and at least partially (e.g., substantially) filled with the selective conductive material 132. Thus, the second regions 126*b* are relatively proximate the contact structures 142 and the first regions 126*a* are relatively distal from the contact structures 142. As shown in FIG. 1F, the second regions 126*b*, including the lateral portions 134 of the selective conductive material 132, may be located within the uppermost conductive structure 108 at the individual steps 114 of the staircase structure 112 and in direct contact with the vertical portions 136 of the conductive plug structures 137. The first regions 126*a* may, optionally, be located within conductive structures 108 vertically underlying the uppermost conductive structure 108. Accordingly, the second regions 126*b* are located below the contact structures 142 and proximate to end surfaces of the steps 114, and the first regions 126*a* may, optionally, be located below the second regions 126*b* of the additional voids 126. While a single step 114 is illustrated as being defined by two of the tiers 110 in FIG. 1F, the single step 114 may, alternatively, be defined by a single (e.g., only one) of the tiers 110.

As shown in FIG. 1F, a lower surface of the contact structure 142 (e.g., the additional conductive material 140 thereof) may directly contact an upper surface of the vertical portions 136 of the selective conductive material 132 along a first interface 144 (e.g., a horizontal interface). Further, one or more side surfaces (e.g., lateral side surfaces, horizontal side surfaces) of the vertical portions 136 of the selective conductive material 132 may directly contact side surfaces of remaining portions of the conductive structures 108 of the stack structure 101 (FIG. 1D) along a second interface 146 (e.g., a vertical interface).

The additional portions 136*a* may, optionally, be located adjacent to the vertical portions 136 of the selective conductive material 132, such as between the upper surface 108*a* of the conductive structures 108 and an outer sidewall of the vertical portions 136, as illustrated in dashed lines in FIG. 1F. The additional portions 136*a* of the selective conductive material 132 may vertically overlie (e.g., vertically overlap) the upper surface 108*a* of the conductive structures 108 along a third interface 148 (e.g., a horizontal interface). Thus, the additional portions 136*a* of the selective conductive material 132 may exhibit a greater lateral extent than a lateral extent of the contact structures 142. In some embodiments, the upper portions of the conductive structures 108 are substantially surrounded by the selective conductive material 132 of the conductive plug structures 137 on at least three consecutive sides. For example, the lateral portions 134 of the selective conductive material 132 may vertically underlie and directly contact the upper portions of the conductive structures 108, the vertical portions 136 thereof may be horizontally adjacent to and directly contact the upper portions of the conductive structures 108, and the additional portions 136*a* thereof may vertically overlie and directly contact the upper portions of the conductive structures 108.

In some embodiments, the additional portions 136*a* of the selective conductive material 132 horizontally extend over the upper surface 108*a* of the conductive structures 108, such that the additional portions 136*a* are uneven (e.g., irregular, asymmetrical) responsive to forming the selective conductive material 132 within the openings 130 (FIG. 1D) and within the second regions 126*b* of the additional voids 126. In other embodiments, side surfaces (e.g., vertical sidewalls) of the vertical portions 136 of the selective conductive material 132 are substantially aligned with side surfaces of one or more (e.g., each) of the liner material 116 and the conductive structures 108, without the additional portions 136*a* vertically overlying the conductive structures 108.

As shown in FIG. 1F, the first liner material 116*a* of the liner material 116 (FIG. 1D) may vertically overlie the steps 114, and the second liner material 116*b* may vertically overlie and directly contact the first liner material 116*a*. A thickness of the first liner material 116*a* may be within a range of from about 5 nm to about 15 nm, such as from about 5 nm to about 10 nm, or from about 10 nm to about 15 nm, and a thickness of the second liner material 116*b* may be within a range of from about 20 nm to about 40 nm, such as from about 20 nm to about 30 nm, or from about 30 nm to about 40 nm. However, the disclosure is not so limited and the thicknesses may be different than those described. In some embodiments, the thickness of the second liner material 116*b* is relatively greater than the thickness of the first liner material 116*a*.

In some embodiments, upper portions of the conductive plug structures 137 extend above the upper surface 108*a* of the conductive structures 108 by less than or equal to about 10 nm (e.g., within a range of from about 2 nm to about 10 nm), such that an upper surface of the vertical portions 136 of the conductive plug structures 137 at the first interface 144 is vertically recessed relative to a lower surface of the second liner material 116*b*. In some such embodiments, the conductive plug structures 137 vertically extend within the first liner material 116*a* and the conductive structures 108 without vertically extending to or within the second liner material 116*b*. In other embodiments, the conductive plug structures 137 extend beyond upper surfaces of the first liner material 116*a* and within or, alternatively, beyond a vertical extent of the second liner material 116*b*.

A first height $H_1$ of the conductive structure 108 (defined as a vertical dimension between the upper surface 108*a* and the lower surface 108*b* of the conductive structure 108) may be within a range of from about 20 nm to about 40 nm, such as from about 20 nm to about 25 nm, from about 25 nm to about 30 nm, from about 30 nm to about 35 nm, or from about 35 nm to about 40 nm. A second height $H_2$ of the conductive plug structures 137 (defined as a vertical dimension between a lower surface of the contact structures 142 and remaining portions of the conductive structures 108) may be within a range of from about 25 nm to about 50 nm, such as from about 25 nm to about 30 nm, from about 30 nm to about 35 nm, from about 35 nm to about 40 nm, from about 40 nm to about 45 nm, or from about 45 nm to about 50 nm. However, the disclosure is not so limited and the heights may be different than those described. In some embodiments, the second height $H_2$ of the conductive plug structures 137 is substantially equal to or relatively greater than the first height $H_1$ of the conductive structure 108.

Forming the conductive plug structures 137 prior to forming the contact structures 142 may facilitate reduced failure rates of electrical connections between the contact structures 142 and the conductive structures 108 of the stack structure 101 during use and operation of the microelectronic device structure 100. In some embodiments, failure rates may be reduced by about 73 percent, or even a higher percentage (e.g., about 88 percent, about 96 percent), compared to failure rates of conventional structures of a 3D NAND structure. Accordingly, the reduced failure rates may be achieved, even while the pitch of the adjacent structures continue to be scaled down to smaller values, while thicknesses (e.g., a height in the Z-direction) of the conductive structures 108 continue to be reduced, and while high aspect ratios (HAR) continue to be increased.

Figure 2:
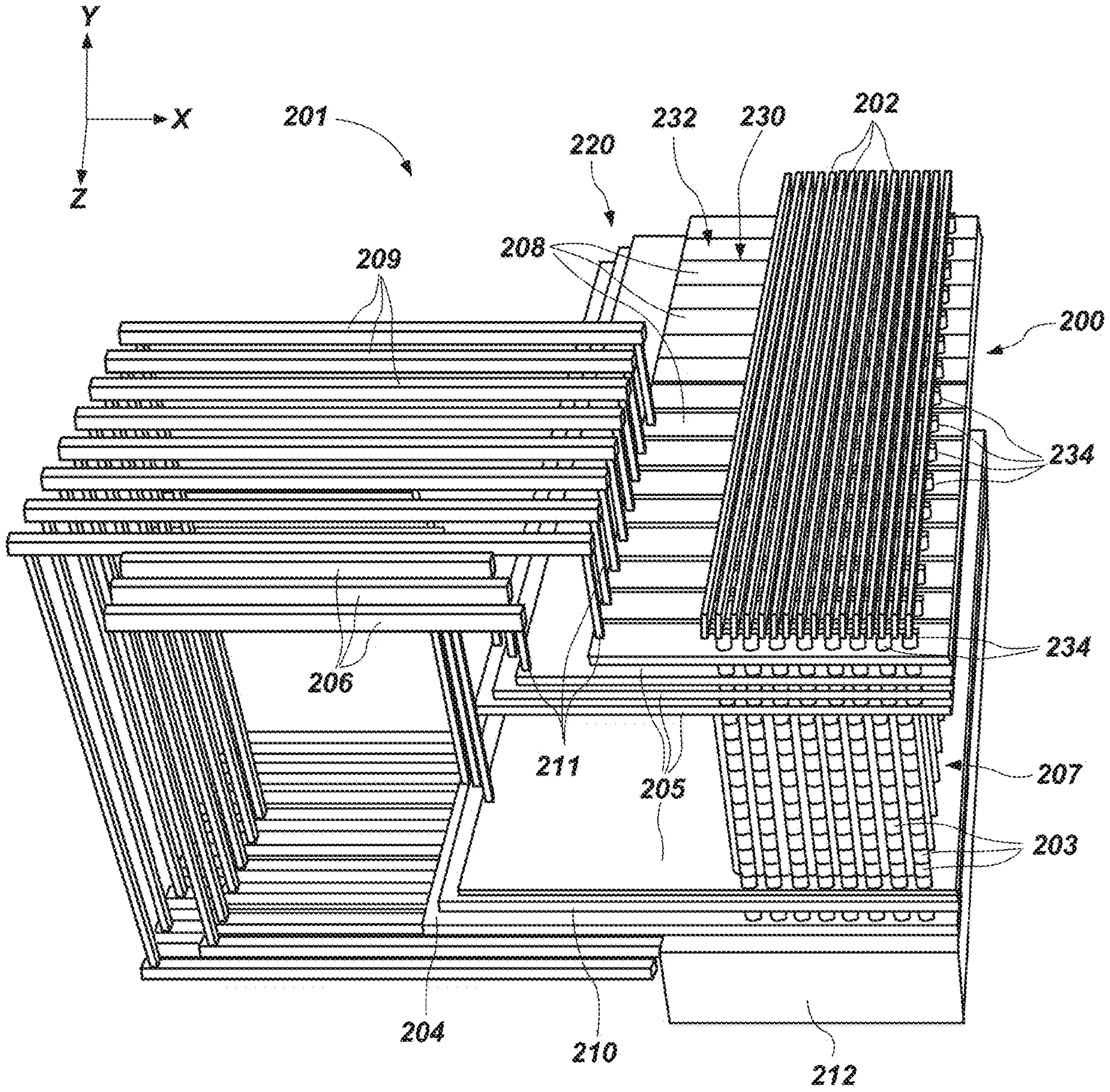
FIG. 2 is a simplified, partial cutaway perspective view of a microelectronic device, in accordance with embodiments of the disclosure.

FIG. 2 illustrates a partial cutaway perspective view of a portion of a microelectronic device 201 (e.g., a memory device, such as a dual deck 3D NAND Flash memory device) including a microelectronic device structure 200. The microelectronic device structure 200 may be substantially similar to the microelectronic device structure 100 previously described with reference to FIGS. 1A through 1F. As shown in FIG. 2, the microelectronic device structure 200 may include a staircase structure 220 (e.g., the staircase structure 112 (FIG. 1D)) defining contact regions for connecting access lines 206 to conductive tiers 205 (e.g., conductive layers, conductive plates, such as the conductive structures 108 (FIG. 1D)). The microelectronic device structure 200 may include vertical strings 207 of memory cells 203 that are coupled to each other in series. The vertical strings 207 may extend vertically (e.g., in the Z-direction) and orthogonally to conductive lines and tiers 205, such as data lines 202, a source tier 204 (e.g., the source structure 102 (FIG. 1D)), the conductive tiers 205, the access lines 206, first select gates 208 (e.g., upper select gates, drain select gates (SGDs)), select lines 209, and a second select gate 210 (e.g., a lower select gate, a source select gate (SGS)). The select gates 208 may be horizontally divided (e.g., in the Y-direction) into multiple blocks 232 horizontally separated (e.g., in the Y-direction) from one another by slots 230.

Vertical conductive contacts 211 (e.g., the contact structures 142 (FIG. 1D)) may electrically couple components to each other as shown. For example, the select lines 209 may be electrically coupled to the first select gates 208 and the access lines 206 may be electrically coupled to the conductive tiers 205. The microelectronic device 201 may also include a control unit 212 positioned under the memory array, which may include at least one of string driver circuitry, pass gates, circuitry for selecting gates, circuitry for selecting conductive lines (e.g., the data lines 202, the access lines 206), circuitry for amplifying signals, and circuitry for sensing signals. The control unit 212 may be electrically coupled to the data lines 202, the source tier 204, the access lines 206, the first select gates 208, and the second select gates 210, for example. In some embodiments, the control unit 212 includes CMOS (complementary metal-oxide-semiconductor) circuitry. In such embodiments, the control unit 212 may be characterized as having a “CMOS under Array” (“CuA”) configuration.

The first select gates 208 may extend horizontally in a first direction (e.g., the X-direction) and may be coupled to respective first groups of vertical strings 207 of memory cells 203 at a first end (e.g., an upper end) of the vertical strings 207. The second select gate 210 may be formed in a substantially planar configuration and may be coupled to the vertical strings 207 at a second, opposite end (e.g., a lower end) of the vertical strings 207 of memory cells 203.

The data lines 202 (e.g., bit lines) may extend horizontally in a second direction (e.g., in the Y-direction) that is at an angle (e.g., perpendicular) to the first direction in which the first select gates 208 extend. The data lines 202 may be coupled to respective second groups of the vertical strings 207 at the first end (e.g., the upper end) of the vertical strings 207. A first group of vertical strings 207 coupled to a respective first select gate 208 may share a particular vertical string 207 with a second group of vertical strings 207 coupled to a respective data line 202. Thus, a particular vertical string 207 may be selected at an intersection of a particular first select gate 208 and a particular data line 202. Accordingly, the first select gates 208 may be used for selecting memory cells 203 of the vertical strings 207 of memory cells 203.

The conductive tiers 205 (e.g., word line plates) may extend in respective horizontal planes. The conductive tiers 205 may be stacked vertically, such that each conductive tier 205 is coupled to all of the vertical strings 207 of memory cells 203, and the vertical strings 207 of the memory cells 203 extend vertically through the stack of conductive tiers 205. The conductive tiers 205 may be coupled to or may form control gates of the memory cells 203 to which the conductive tiers 205 are coupled. Each conductive tier 205 may be coupled to one memory cell 203 of a particular vertical string 207 of memory cells 203.

The first select gates 208 and the second select gates 210 may operate to select a particular vertical string 207 of the memory cells 203 between a particular data line 202 and the source tier 204. Thus, a particular memory cell 203 may be selected and electrically coupled to a data line 202 by operation of (e.g., by selecting) the appropriate first select gate 208, second select gate 210, and conductive tier 205 that are coupled to the particular memory cell 203.

The staircase structure 220 may be configured to provide electrical connection between the access lines 206 and the tiers 205 through the vertical conductive contacts 211. In other words, a particular level of the tiers 205 may be selected via an access line 206 in electrical communication with a respective conductive contact 211 in electrical communication with the particular tier 205. The data lines 202 may be electrically coupled to the vertical strings 207 through conductive contact structures 234.

Accordingly, in some embodiments, a microelectronic device comprises a stack structure comprising alternating conductive structures and insulative structures arranged in tiers. Each of the tiers individually comprises a conductive structure and an insulative structure. The microelectronic device comprises a staircase structure having steps comprising lateral ends of the tiers, and contacts overlying the steps at different elevations of the staircase structure. The contacts comprise a liner material. The microelectronic device comprises conductive plug structures underlying the liner material of the contacts and comprising lateral portions within voids in at least some of the conductive structures, and vertical portions overlying the lateral portions.

Furthermore, in some embodiments, a method of forming a microelectronic device comprises forming a preliminary stack structure comprising a vertically alternating sequence of insulative material and sacrificial material arranged in preliminary tiers, and forming dielectric material over a staircase structure within the preliminary stack structure. The staircase structure has steps comprising lateral ends of the preliminary tiers of the preliminary stack structure. The method comprises replacing the sacrificial material with conductive structures, forming openings extending through the dielectric material and exposing portions of the conductive structures at the steps of the staircase structure, and selectively forming conductive material within voids in the conductive structures and within the openings to form conductive plug structures. The conductive plug structures individually comprise lateral portions within the voids in at least some of the conductive structures, and vertical portions overlying the lateral portions. The method comprises forming conductive contacts over the steps of the staircase structure. The conductive contacts individually comprise a liner material and additional conductive material within the openings and overlying the conductive material of the conductive plug structures.

Figure 3:
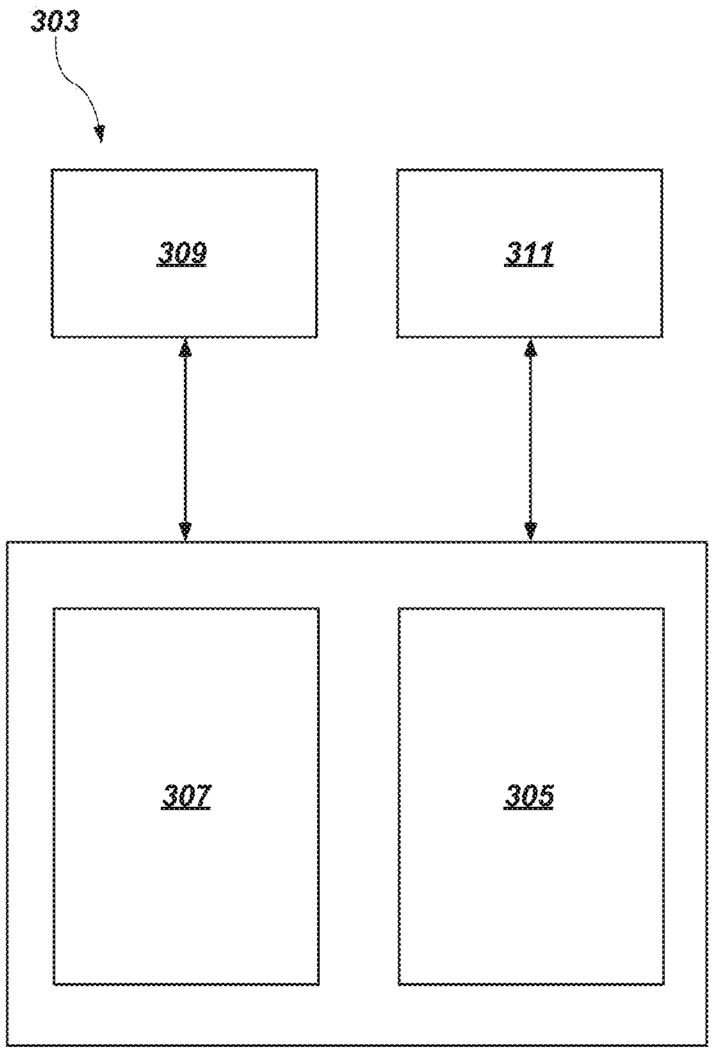
FIG. 3 is a block diagram of an electronic system, in accordance with embodiments of the disclosure.

Microelectronic devices including microelectronic devices (e.g., the microelectronic device 201) and microelectronic device structures (e.g., the microelectronic device structures 100, 200) including the lateral portions 134 and the vertical portions 136 of the conductive plug structures 137 adjacent to the contact structures 142 with embodiments of the disclosure may be used in embodiments of electronic systems of the disclosure. For example, FIG. 3 is a block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of a microelectronic device structure previously described herein (e.g., the microelectronic device structures 100, 200) or a microelectronic device (e.g., the microelectronic device 201) previously described with reference to FIGS. 1A through 1F and FIG. 2 including the lateral portions 134 and the vertical portions 136 of the conductive plug structures 137 adjacent to the contact structures 142.

The electronic system 303 may further include at least one electronic signal processor device 307 (often referred to as a "microprocessor"). The electronic signal processor device 307 may, optionally, include an embodiment of a microelectronic device or a microelectronic device structure previously described herein (e.g., one or more of the microelectronic device 201 or the microelectronic device structures 100, 200 previously described with reference to FIGS. 1A through 1F and FIG. 2). The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Accordingly, in some embodiments, an electronic system comprises a processor operably coupled to an input device and an output device, and a microelectronic device operably coupled to the processor. The microelectronic device comprises a stack structure comprising a vertically alternating sequence of conductive structures and insulative structures arranged in tiers, a staircase structure within the stack structure and having steps comprising lateral edges of the tiers, contact structures terminating on the steps of the staircase structure, conductive plugs between the steps of the staircase structure and a liner material of the contact structures, and conductive fill material circumferentially surrounding at least some of the conductive plugs. The conductive fill material is between vertically opposing portions of conductive material within at least some of the conductive structures of the stack structure.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:

a stack structure comprising alternating conductive structures and insulative structures arranged in tiers, each of the tiers individually comprising a conductive structure and an insulative structure;

a staircase structure having steps comprising lateral ends of the tiers;

contacts overlying the steps at different elevations of the staircase structure, the contacts comprising a liner material; and conductive plug structures underlying the liner material of the contacts and comprising:

lateral portions within voids in at least some of the conductive structures; and vertical portions overlying the lateral portions.

2. The microelectronic device of claim 1, wherein the vertical portions of the conductive plug structures are interposed directly between the liner material of the contacts and the lateral portions of the conductive plug structures, the conductive plug structures substantially free of a liner material on vertical sidewalls of the vertical portions of the conductive plug structures.

3. The microelectronic device of claim 1, wherein the contacts comprise conductive material substantially surrounded by the liner material, a material composition of the conductive material of the contacts substantially the same as a material composition of the conductive structures of the stack structure.

4. The microelectronic device of claim 1, wherein the conductive plug structures comprise a different material composition than the conductive structures of the stack structure.

5. The microelectronic device of claim 1, wherein the conductive plug structures comprise additional portions extending beyond horizontal boundaries of the contacts, the additional portions directly vertically adjacent to the conductive structures of the stack structure.

6. The microelectronic device of claim 1, wherein the conductive plug structures extend below upper surfaces of the conductive structures of the stack structure, the conductive plug structures individually exhibiting a height equal to or greater than a height of each of the conductive structures.

7. The microelectronic device of claim 1, wherein the conductive plug structures individually form an L-shaped structure proximate uppermost conductive structures partially defining the steps.

8. The microelectronic device of claim 1, wherein a lateral extent of individual lateral portions of the conductive plug structures is relatively greater than a lateral extent of vertical portions thereof, the lateral extent of the individual lateral portions of the conductive plug structures varying from one another throughout the stack structure.

9. The microelectronic device of claim 1, wherein the conductive structures at the steps directly physically contact the conductive plug structures, upper portions of the conductive structures substantially surrounded by additional conductive material of the conductive plug structures on at least three consecutive sides.

10. An electronic system, comprising:

a processor operably coupled to an input device and an output device; and a microelectronic device operably coupled to the processor, the microelectronic device comprising:

a stack structure comprising a vertically alternating sequence of conductive structures and insulative structures arranged in tiers;

a staircase structure within the stack structure and having steps comprising lateral edges of the tiers;

contact structures terminating on the steps of the staircase structure;

conductive plugs between the steps of the staircase structure and a liner material of the contact structures; and conductive fill material circumferentially surrounding at least some of the conductive plugs, the conductive fill material between vertically opposing portions of conductive material within at least some of the conductive structures of the stack structure.

11. The electronic system of claim 10, wherein the conductive fill material substantially surrounds the conductive plugs in at least one horizontal direction, the conductive fill material having a greater lateral dimension than the contact structures.

12. The electronic system of claim 10, wherein the conductive plugs are directly on the conductive fill material, upper surfaces of the conductive plugs extending above upper surfaces of the conductive structures at the steps.

13. The electronic system of claim 10, wherein the conductive plugs and the conductive fill material physically contact one of the conductive structures of the stack structure on a lateral side and on a vertical side.

14. The electronic system of claim 10, further comprising a nitride liner material overlying the steps of the staircase structure, uppermost boundaries of the conductive plugs vertically below lowermost boundaries of the nitride liner material.

* * * * *